US012574028B2

(12) United States Patent
Suzuki et al.

(10) Patent No.: US 12,574,028 B2
(45) Date of Patent: Mar. 10, 2026

(54) DRIVE DEVICE FOR SEMICONDUCTOR SWITCHING ELEMENT, DRIVING METHOD THEREFOR, AND POWER CONVERSION DEVICE

(71) Applicant: HITACHI ASTEMO, LTD., Hitachinaka (JP)

(72) Inventors: Hiroshi Suzuki, Tokyo (JP); Shinichirou Wada, Tokyo (JP); Masahiro Doi, Hitachinaka (JP); Yoshiaki Mizuhashi, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 325 days.

(21) Appl. No.: 18/287,940

(22) PCT Filed: Feb. 24, 2022

(86) PCT No.: PCT/JP2022/007762
§ 371 (c)(1),
(2) Date: Oct. 23, 2023

(87) PCT Pub. No.: WO2022/230337
PCT Pub. Date: Nov. 3, 2022

(65) Prior Publication Data
US 2024/0195283 A1     Jun. 13, 2024

(30) Foreign Application Priority Data

Apr. 30, 2021     (JP) ................................. 2021-078041

(51) Int. Cl.
*H02M 1/08*      (2006.01)
*H03K 17/16*      (2006.01)
*H02P 27/06*      (2006.01)

(52) U.S. Cl.
CPC ............ *H03K 17/165* (2013.01); *H02M 1/08* (2013.01); *H03K 17/161* (2013.01); *H02P 27/06* (2013.01)

(58) Field of Classification Search
CPC ........ H02M 1/08; H02P 27/06; H03K 17/161; H03K 17/165
(Continued)

(56) References Cited

U.S. PATENT DOCUMENTS

2010/0176783 A1     7/2010   Tagome
2011/0133790 A1     6/2011   Nagata et al.
(Continued)

FOREIGN PATENT DOCUMENTS

JP          2010-119184 A      5/2010
JP          2011-120418 A      6/2011
(Continued)

OTHER PUBLICATIONS

Hiroshi Suzuki, et al., "Noise Suppression in SiC-MOSFET Body Diode Turn-Off Operation with Simple and Robust Gate Driver", IEICE Transactions on Electronics, vol. E105-C, No. 12, Dec. 2022.
(Continued)

*Primary Examiner* — William Hernandez
(74) *Attorney, Agent, or Firm* — MATTINGLY & MALUR, PC

(57) ABSTRACT

A drive device for a voltage-driven semiconductor switching element includes: a gate drive circuit configured to drive the semiconductor switching element; and a gate voltage hold circuit configured to hold a gate voltage applied to the semiconductor switching element at a predetermined hold voltage higher than a threshold voltage of the semiconductor switching element and lower than a Miller voltage of the semiconductor switching element. The gate voltage hold circuit starts an operation of holding the gate voltage at the
(Continued)

hold voltage after a rise of a voltage between main terminals of the semiconductor switching element at a turn-off time of the semiconductor switching element and before a maximum value of the voltage between the main terminals.

9 Claims, 11 Drawing Sheets

(58) Field of Classification Search
USPC .................................. 327/108, 109, 110, 111
See application file for complete search history.

(56) References Cited

U.S. PATENT DOCUMENTS

| | | | | |
|---|---|---|---|---|
| 2014/0139268 A1 * | 5/2014 | Bayerer | ............... | H03K 17/063 |
| | | | | 327/109 |
| 2015/0124502 A1 | 5/2015 | Watanabe et al. | | |
| 2015/0318850 A1 | 11/2015 | Hiyama | | |
| 2017/0099046 A1 | 4/2017 | Osanai et al. | | |

FOREIGN PATENT DOCUMENTS

| | | | |
|---|---|---|---|
| JP | 2015-091208 A | 5/2015 |
| JP | 2017-070164 A | 4/2017 |
| WO | 2008/155917 A1 | 12/2008 |
| WO | 2014-097486 A1 | 6/2014 |

OTHER PUBLICATIONS

International Search Report of PCT/JP2022/007762 dated May 10, 2022.
Japanese Office Action received in corresponding Japanese Application No. 2021-078041 dated Oct. 22, 2024.

* cited by examiner

DRIVE DEVICE FOR SEMICONDUCTOR SWITCHING ELEMENT, DRIVING METHOD THEREFOR, AND POWER CONVERSION DEVICE

TECHNICAL FIELD

The present invention relates to a drive device for a semiconductor switching element, a driving method therefor, and a power conversion device.

BACKGROUND ART

Semiconductor switching elements are included in, for example, inverter circuits, and are used as power conversion devices by performing switching operations. In such semiconductor switching elements, switching losses occur as the switching operations are turned on and off. When the semiconductor switching elements are turned off, times required for the switching become shorter as gate driving speeds increase. Therefore, the switching losses decrease, but surge voltages of voltages between main terminals increase. When the semiconductor switching elements are turned off, ringing in which voltages or currents sharply increase and decrease repeatedly occurs. When the ringing occurs, electromagnetic noise increases. Therefore, from the viewpoint of securing insulation properties for semiconductor switching elements and circuits connected to the semiconductor switching elements, it is required to reduce not only ringing of the semiconductor switching elements but also surge voltages.

PTL 1 discloses a device that controls a gate voltage to a value higher than a threshold after a timing at which a voltage between main terminals of a semiconductor switching element reaches a peak value, and attenuates ringing vibration when the switching element is turned off.

CITATION LIST

Patent Literature

PTL 1: JP 2017-70164 A

SUMMARY OF INVENTION

Technical Problem

In the device of PTL 1, a surge voltage at the turn-off time of the switching element cannot be reduced.

Solution to Problem

According to an aspect of the present invention, a drive device for a voltage-driven semiconductor switching element includes: a gate drive circuit configured to drive the semiconductor switching element; and a gate voltage hold circuit configured to hold a gate voltage applied to the semiconductor switching element at a predetermined hold voltage higher than a threshold voltage of the semiconductor switching element and lower than a Miller voltage of the semiconductor switching element. The gate voltage hold circuit starts an operation of holding the gate voltage at the hold voltage after a rise of a voltage between main terminals of the semiconductor switching element at a turn-off time of the semiconductor switching element and before a maximum value of the voltage between the main terminals.

A driving method for a semiconductor switching element according to another aspect of the present invention is a driving method for a voltage-driven semiconductor switching element, the method including: starting an operation of holding a gate voltage applied to the semiconductor element at a predetermined hold voltage higher than a threshold voltage of the semiconductor switching element and lower than a Miller voltage of the semiconductor switching element after a rise of a voltage between main terminals of the semiconductor switching element at a turn-off time of the semiconductor switching element and before a maximum value of the voltage between the main terminals.

Advantageous Effects of Invention

According to the present invention, it is possible to reduce a surge voltage when the switching element is turned off.

DESCRIPTION OF EMBODIMENTS

Figure 1:
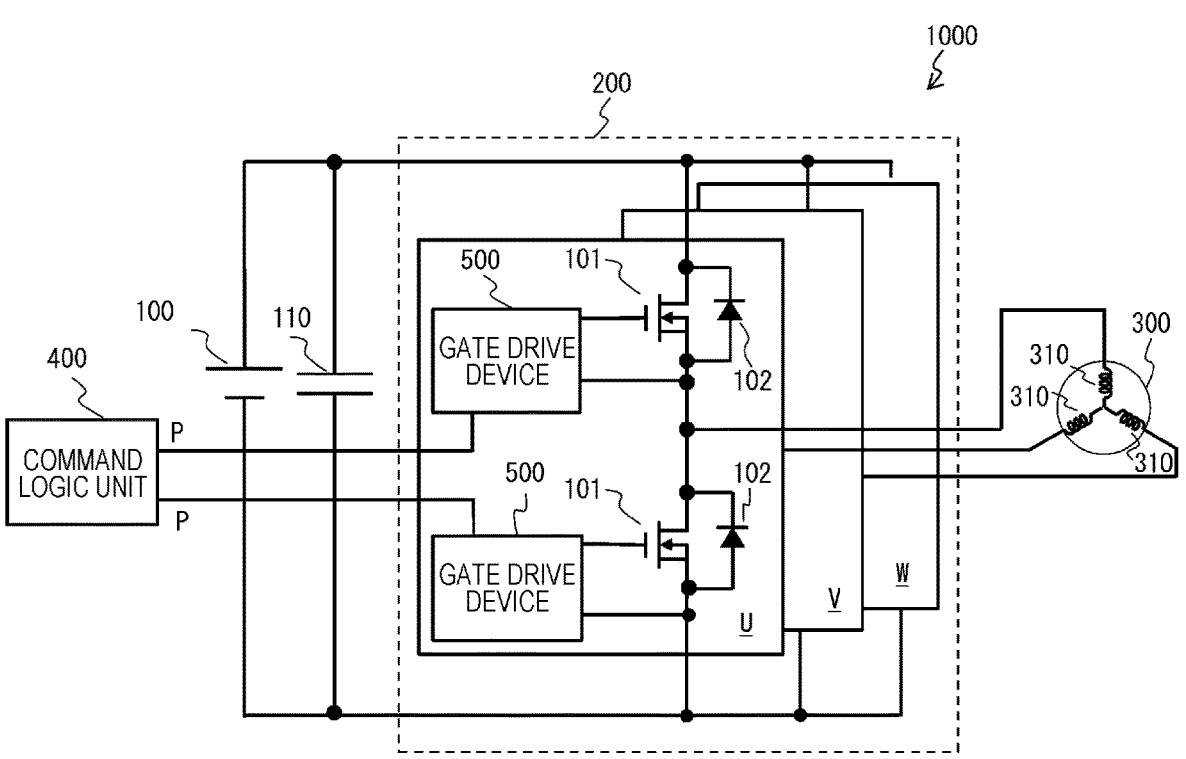
FIG. 1 is a diagram illustrating an overall configuration of an electric motor control system using a power conversion device.

Hereinafter, first and second embodiments will be described as embodiments of the present invention with reference to the drawings. In the present embodiment, the semiconductor switching element is included in, for example, an inverter circuit and is used as a power conversion device by performing a switching operation. The power conversion device outputs an alternating current based on supplied direct current power to drive an electric motor of an electric vehicle or a hybrid vehicle. In the first and second embodiments, the same reference numerals indicate the same configuration or configurations having similar functions.

First Embodiment

FIG. 1 is a diagram illustrating an overall configuration of an electric motor control system using a power conversion device 1000.

The power conversion device 1000 outputs an alternating current based on direct current power supplied from a battery 100 to drive an electric motor 300.

The power conversion device 1000 includes an inverter circuit 200 and a command logic unit 400. A smoothing capacitor 110 is provided between a positive electrode connection line and a negative electrode connection line of the battery 100 and the inverter circuit 200.

The inverter circuit 200 includes a series circuit of semiconductor switching elements 101 including upper and lower arms for three UVW phases. Each of the semiconductor switching elements 101 of the upper and lower arms is configured with, for example, a MOSFET. The high-potential side terminal of the MOSFET of the upper arm of each phase is connected to a first end (positive electrode connection line) of the smoothing capacitor 110. The high-potential side terminal of the MOSFET of the lower arm of each phase is connected to a low potential terminal side of the MOSFET of the upper arm of each phase. A low-voltage terminal side of the MOSFET of the lower arm of each phase is connected to the second end (negative electrode connection line) of the smoothing capacitor 110.

In each phase, a connection point between the low-potential side terminal of the MOSFET of the upper arm and the high-potential side terminal of the MOSFET of the lower arm is connected to one end of a winding 310 of the electric motor 300. The other end of the winding 310 of each phase is connected to a neutral point. The electric motor 300 is, for example, a permanent magnet field type synchronous electric motor.

The semiconductor switching element 101 is not limited to the MOSFET and may be a voltage-driven semiconductor switching element 101 such as an IGBT. A semiconductor included in the semiconductor switching element 101 may be silicon (Si) or a wide-gap semiconductor (silicon carbide (SiC), gallium nitride (GaN), or the like).

When the semiconductor switching element 101 is a MOSFET, it is, for example, a SiC-MOSFET. Therefore, in the MOSFET, the high-potential side terminal is a drain, and the low-potential side terminal is a source. A freewheeling diode (freewheel diode) 102 is connected in antiparallel to each MOSFET. As the freewheeling diode 102, any of various diodes such as a pn junction diode, a Schottky barrier diode, and a diode using a combination of a pn junction and a Schottky junction can be used. When the semiconductor switching element 101 is a SiC-MOSFET, the freewheeling diode 102 may be replaced with a body diode of the SiC-MOSFET. In the following description, the semiconductor switching element 101 that is a MOSFET will be described as an example.

The command logic unit 400 outputs an ON command to give an instruction for an ON state or an OFF command to give an instruction for an OFF state to the gate drive device 500 as a drive command signal P for the semiconductor switching element 101. Accordingly, the command logic unit 400 alternately turns on the semiconductor switching element 101 of the upper arm and the semiconductor switching element 101 of the lower arm in each phase in order to control a control amount of the electric motor 300 to the command value. The control amount is, for example, a torque of the electric motor 300.

The gate drive device 500 is provided to correspond to each semiconductor switching element 101, acquires the drive command signal P from the command logic unit 400, and turns on or off the semiconductor switching element 101 based on the acquired drive command signal P.

Figure 2:
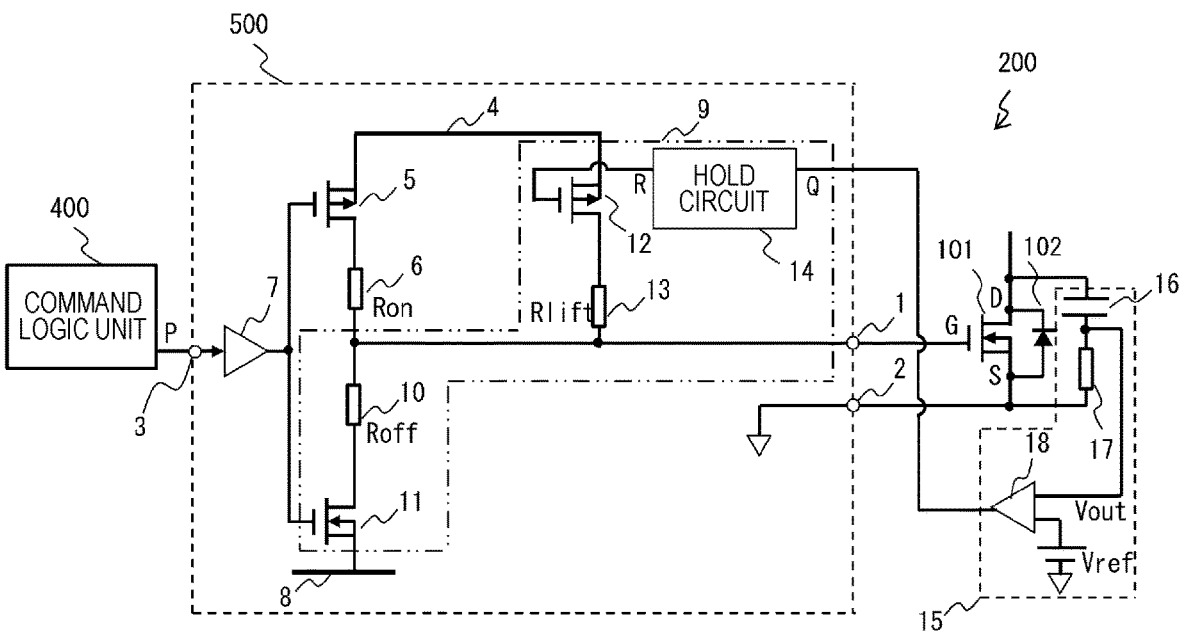
FIG. 2 is a circuit diagram of a gate drive device according to a first embodiment.

FIG. 2 is a circuit diagram of the gate drive device 500 according to the first embodiment.

FIG. 2 illustrates the semiconductor switching element 101 according to the U-phase lower arm in the inverter circuit 200 illustrated in FIG. 1 and the gate drive device 500. In addition, the semiconductor switching elements 101 of the U-phase upper arm, the V-phase and W-phase upper and lower arms, and the gate drive devices 500 have the same configuration. Hereinafter, the configurations and operations of semiconductor switching element 101 of the U-phase lower arm and the gate drive device 500 will be described, but the configurations and operations of the other semiconductor switching elements 101 and the gate drive devices 500 are similar.

The gate drive device 500 includes a positive-side power supply 4, a first MOSFET 5, an on-side gate resistor 6, a buffer circuit 7, a negative-side power supply 8, and a gate voltage hold circuit 9.

The gate voltage hold circuit 9 includes an off-side gate resistor 10, a second MOSFET 11, a gate voltage pull-up MOSFET 12, a gate voltage pull-up resistor 13, and a hold circuit 14.

The output unit 1 of the gate drive device 500 is connected to a gate terminal G of the semiconductor switching element 101. The reference potential 2 of the gate drive device 500 is connected to a source terminal S of the semiconductor switching element 101. The command logic unit 400 is connected to the input unit 3 of the gate drive device 500.

The source of the first MOSFET 5 and the source of the gate voltage pull-up MOSFET 12 are connected to the positive-side power supply 4. The drain of the first MOSFET 5 is connected to one end of the on-side gate resistor 6, and the drain of the second MOSFET 11 is connected to one end of the off-side gate resistor 10. The other end of the on-side gate resistor 6 and the other end of the off-side gate resistor 10 are both connected to the output unit 1 of the gate drive device 500.

The source of the second MOSFET 11 is connected to the negative-side power supply 8. Both the gate of the first MOSFET 5 and the gate of the second MOSFET 11 are connected to an output unit of the buffer circuit 7, and the input unit 3 of the gate drive device 500 is connected to an input unit of the buffer circuit 7.

The drain of the gate voltage pull-up MOSFET 12 is connected to the output unit 1 of the gate drive device 500 via the gate voltage pull-up resistor 13. The output unit R of the hold circuit 14 is connected to the gate of the gate voltage pull-up MOSFET 12, and the input unit Q of the hold circuit 14 is connected to the detection circuit 15.

The detection circuit 15 includes a capacitor 16, a resistor 17, and a comparator 18. In a differential circuit including the capacitor 16 and the resistor 17, one end of the capacitor 16 is connected to the drain terminal D of the MOSFET, and one end of the resistor 17 is connected to the source terminal S of the semiconductor switching element 101. Both the other end of the capacitor 16 and the other end of the resistor 17 are connected to a first input terminal of the comparator 18, and a second input terminal of the comparator 18 is connected to a voltage source of a reference voltage Vref. An output terminal of the comparator 18 is connected to an input unit Q of the hold circuit 14 in the gate voltage hold circuit 9.

The drive command signal P is input from the command logic unit 400 to the gate drive device 500. The gate drive device 500 operates the buffer circuit 7 to turn on the first MOSFET 5 and turn off the second MOSFET 11 while the drive command signal P is input. Accordingly, a current (gate current) flows from the positive-side power supply 4 to the gate of the semiconductor switching element 101 via the on-side gate resistor 6. At this time, capacitance between the gate and the source (between the G-S terminals) of the semiconductor switching element 101 is charged, a voltage (for example, +18 V) exceeding a threshold voltage of the semiconductor switching element 101 is applied, so that the semiconductor switching element 101 is turned on to flow a current in the semiconductor switching element 101 (turn-on). A turn-on switching speed is controlled by adjusting a resistant value (Ron) of the on-side gate resistor 6.

The gate drive device 500 operates the buffer circuit 7 to turn off the first MOSFET 5 and turn on the second MOSFET 11 while the drive command signal P is not input from the command logic unit 400. Accordingly, a gate current flows from the gate of the semiconductor switching element 101 to the negative-side power supply 8 via the off-side gate resistor 10. At this time, the capacitance between the G-S terminals of the semiconductor switching element 101 is discharged, a voltage (for example, −5 V) lower than the threshold voltage of the semiconductor switching element 101 is applied, so that the semiconductor switching element 101 is turned off to cut off the current of the semiconductor switching element 101 (turn-off). The turn-off switching speed is controlled by adjusting the resistant value (Roff) of the off-side gate resistor 10. The potential of the negative-side power supply 8 is not necessarily negative, and may be, for example, a reference potential (0 V).

As described above, a gate drive circuit driving the voltage-driven semiconductor switching element 101 in accordance with the drive command signal P from the command logic unit 400 includes the first MOSFET 5, the on-side gate resistor 6, the second MOSFET 11, and the off-side gate resistor 10.

As details will be described below, the detection circuit 15 detects a rise of a drain-source voltage (VDS) of the semiconductor switching element 101 by comparing the rise with the reference voltage Vref of the comparator 18 when the semiconductor switching element 101 is turned off. When the rise of the drain-source voltage (VDS) is detected, a detection signal is output to the input unit Q of the hold circuit 14. After the detection signal is input from the detection circuit 15, that is, after a rise of a voltage between main terminals which is the drain-source voltage (VDS) of the semiconductor switching element 101 at the turn-off time of the semiconductor switching element 101, the gate voltage hold circuit 9 starts an operation of holding the voltage between the main terminals at a predetermined hold voltage before a maximum value of the voltage between the main terminals. That is, when the gate voltage hold circuit 9 starts operating, the gate voltage pull-up MOSFET 12 is turned on. Accordingly, the gate voltage applied to the semiconductor switching element 101 is held at a predetermined hold voltage Vkeep that is higher than the threshold voltage of the semiconductor switching element 101 and lower than the Miller voltage of the semiconductor switching element 101.

Figure 3:
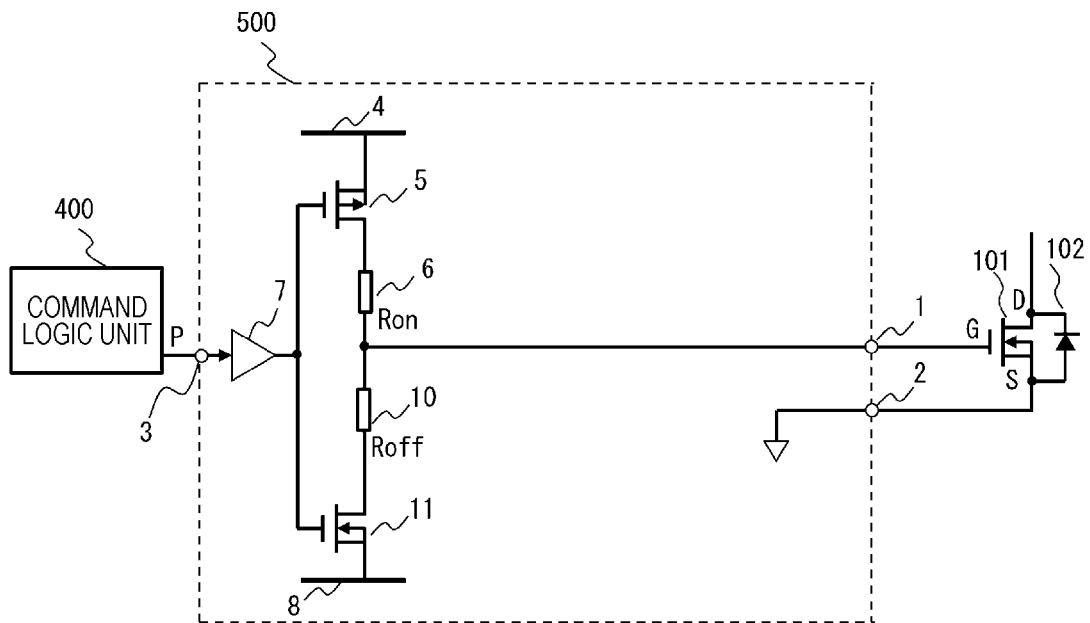
FIG. 3 is a circuit diagram of a gate drive device according to a comparative example.

FIG. 3 is a circuit diagram of a gate drive device 500 according to a comparative example.

The gate drive device 500 according to the comparative example has a configuration in which the gate voltage hold circuit 9 and the detection circuit 15 are removed from the circuit diagram of the gate drive device 500 according to the present embodiment, as illustrated in FIG. 2. In this comparative example, the gate drive device 500 to which the present embodiment is not applied is shown for comparison with the present embodiment. The same configurations as those of the present embodiment illustrated in FIG. 2 are denoted by the same reference numerals, and the description thereof will be simplified.

When the drive command signal P is input from the command logic unit 400 to the gate drive device 500, the first MOSFET 5 is turned on and the second MOSFET 11 is turned off. Then, the semiconductor switching element 101 is turned on so that a current flows in the semiconductor switching element 101 (turn-on).

While the drive command signal P is not input from the command logic unit 400, the first MOSFET 5 is turned off and the second MOSFET 11 is turned on. Then, the semiconductor switching element 101 is turned off to cut off the current of the semiconductor switching element 101 (turn-off).

FIGS. 4(A), 4(B), 4(C), 4(D), 4(E), 4(F), and 4(G) are diagrams illustrating examples of waveforms of the semiconductor switching element 101 when the semiconductor switching element is turned off. Solid lines in FIGS. 4(B), 4(C), 4(D), and 4(E) indicate waveforms in the gate drive device 500 in FIG. 3 as a comparative example. Broken lines in these drawings are waveforms in the gate drive device 500 of FIG. 2 according to the present embodiment, and mainly indicate differences from the comparative example.

FIG. 4(A) illustrates a gate-off command P from the command logic unit 400, FIG. 4(B) illustrates a gate current of the semiconductor switching element 101, FIG. 4(C) illustrates a gate-source voltage of the semiconductor switching element 101, and FIG. 4(D) illustrates a drain current of the semiconductor switching element 101. FIG. 4(E) illustrates a drain-source voltage of the semiconductor switching element 101, FIG. 4(F) illustrates an output signal (V$_{OUT}$) in the detection circuit 15, and FIG. 4(G) illustrates an ON command (R) to the gate voltage pull-up MOSFET 12. FIGS. 4(D) and 4(E) cross each other halfway, and the positions thereof are exchanged.

Hereinafter, turn-off of the semiconductor switching element 101 illustrated in FIGS. 4(A), 4(B), 4(C), 4(D), 4(E), 4(F), and 4(G) will be described with reference to FIG. 2 and the like.

As illustrated in FIG. 4(A), at time t0, a gate-off command P for turning off the semiconductor switching element 101 is input from the command logic unit 400. Then, as illustrated in FIG. 4(C), the gate-source voltage (VGS) of the semiconductor switching element 101 decreases. From time t1, the semiconductor switching element 101 enters a Miller period in which VGS is constant. At the same time, as illustrated in FIG. 4(E), the drain-source voltage (VDS) (hereinafter referred to as a voltage between the main terminals) starts to rise.

When VDS rises, as illustrated in FIG. 4(F), a voltage (VOUT) corresponding to a differential waveform of VDS is output in the detection circuit 15. When VOUT increases with an increase in VDS and VOUT>Vref is satisfied in the comparator 18 at time t2, the detection circuit 15 detects turn-off of the semiconductor switching element 101 and outputs a detection signal Q to the hold circuit 14.

As illustrated in FIG. 4(G), the hold circuit 14 outputs the ON command R of the gate voltage pull-up MOSFET 12 at time t3 after a certain circuit delay d has elapsed. Accordingly, the gate voltage pull-up MOSFET 12 is switched from OFF to ON, and an ON state is held for a certain time T (hold time T). When the gate voltage pull-up MOSFET 12 shifts to the ON state at time t3, the first MOSFET 5 is in an OFF state and the second MOSFET 11 is in the ON-state.

Therefore, a potential of the output unit 1 of the gate drive device 500 substantially matches a value obtained by dividing a voltage between the positive-side power supply 4 (voltage: Vp) and the negative-side power supply 8 (voltage: Vm) by the gate voltage pull-up resistor 13 (resistant value: Rlift) and the off-side gate resistor 10 (resistant value: Roff). That is, during a period between time t3 and time t5 when the ON command R of the gate voltage pull-up MOSFET 12 is output, an output voltage of the gate drive device 500 (a voltage between the output unit 1 and the reference potential 2) is held at the hold voltage Vkeep expressed by the following Expression (1).

$$Vkeep=(Vp-Vm)*Roff/(Rlift+Roff)+Vm \qquad (1)$$

That is, the gate voltage hold circuit 9 operates during the period from time t3 to time t5, so that an absolute value of the output voltage of the gate drive device 500 decreases from |Vm| to |Vkeep| (|Vm|>|Vkeep|).

Accordingly, as indicated by a broken line in FIG. 4(B), an absolute value of the gate current (IG) for discharging the capacitance between the G-S terminals of the semiconductor switching element 101 decreases from time t3. Accordingly, a speed at which the semiconductor switching element 101 is turned off to cut off the current of the semiconductor switching element 101 also decreases after time t3. Then, as indicated by the broken line in FIG. 4(E), a rise speed (dv/dt) of the drain-source voltage (VDS) of the semiconductor switching element 101 also decreases after time t3, so that a surge voltage (Vsurge) of VDS can be reduced, compared with the comparative example indicated by the solid line.

In this way, in order to reduce the surge voltage, it is necessary to decrease dv/dt. Therefore, a timing (time t3) at which the absolute value of the gate current decreases is required to be earlier than a timing (time t4) at which VDS reaches the maximum value. That is, time t3 at which the gate voltage pull-up MOSFET 12 is turned on and the gate voltage hold circuit 9 starts operating is required to precede time t4 at which VDS reaches the maximum value.

As in the present embodiment, when an increase (rise) of VDS is detected using the detection circuit 15, the rise of VDS is detected after time t1 when the semiconductor switching element 101 enters the Miller period and VDS starts rising. A detection timing of the rise of VDS (time t2) can be set by adjusting the reference voltage Vref of the comparator 18. Accordingly, time t3 at which gate voltage hold circuit 9 starts operating is set to precede time t4 at which VDS reaches the maximum value.

In general, VDS continuously and smoothly rises when the semiconductor switching element 101 is turned off. Therefore, it is difficult to uniquely detect the rise of the voltage between the main terminals from the waveform of VDS. In the present embodiment, the rise of the voltage between the main terminals is detected by detecting VOUT>Vref in the comparator 18 using the phenomenon in which the output voltage VOUT in the detection circuit 15 increases with the rise of VDS of the semiconductor switching element 101. Accordingly, detection time t2 of the rise of the voltage VDS between the main terminals illustrated in FIG. 4(E) is not necessarily limited to a timing of an "inflection point A" in the drawing. Specifically, the rise of the voltage VDS between the main terminals may be detected at any time point within a period from time t1 when the semiconductor switching element 101 enters the Miller period and VDS starts rising to time t3 when the change rate dv/dt of the voltage between the main terminals of the semiconductor switching element 101 becomes maximum and the output signal VOUT of the detection circuit 15 illustrated in FIG. 4(F) becomes maximum.

Although it has been described that the operation of the gate voltage hold circuit 9 is required to be started at timing earlier than the timing at which VDS reaches the maximum value, the operation is not necessarily limited to the operation of the gate voltage hold circuit 9 at time t3. That is, the time at which the gate voltage hold circuit 9 starts the operation may be appropriately set at any time within the period from the detection time t2 of the rise of the voltage VDS between the main terminals to time t4 at which VDS reaches the maximum value. FIG. 4(G) illustrates an example thereof.

As indicated by the broken line in FIG. 4(B), the gate voltage hold circuit 9 starts operating at time t3, so that the absolute value of the gate current (IG) decreases. As illustrated in FIG. 4(G), when the gate voltage hold circuit 9 starts operating at time t3, the ON command (R) of the gate voltage pull-up MOSFET 12 becomes high. However, as illustrated in FIG. 4(C), at time t3, even when the gate voltage hold circuit 9 starts operating, the gate-source voltage (VGS) of the semiconductor switching element 101 remains constant at the Miller voltage (Vmiller). That is, during the period between time t3 and time t5, the output voltage of the gate drive device 500 is held at Vkeep expressed by Expression (1), but VGS of the semiconductor switching element 101 remains constant at Vmiller until time B when the Miller period ends, as indicated by a broken line in FIG. 4(C).

After time B when the Miller period ends, VGS of the semiconductor switching element 101 is held not at Vmiller but at Vkeep, until time t5. This is because VGS of the semiconductor switching element 101 during the Miller period is held at the Miller voltage of the following Expression (2) determined by the characteristics of the semiconductor switching element 101 itself without depending on the gate control voltage (output voltage of the gate drive device 500) from the outside.

$$Vmiller=Vth+ID/gm \qquad (2)$$

Here, Vth is a threshold voltage of the semiconductor switching element 101 which is a MOSFET, ID is a drain current flowing in the semiconductor switching element 101, and gm is a transfer conductance of the semiconductor switching element 101.

As illustrated in FIG. 4(C), the gate-source voltage (VGS) is held at Vkeep from time B when the Miller period ends to time t5. At this time, Vkeep is held at a value lower than the Miller voltage Vmiller of the semiconductor switching element 101 and higher than the threshold voltage Vth of the semiconductor switching element 101. By raising (holding) VGS to Vkeep higher than Vth for a certain period of time, a current (tail current: Itail) expressed by the following Expression (3) flows in the semiconductor switching element 101.

$$Itail=gm*(Vkeep-Vth) \qquad (3)$$

Accordingly, the tail current (Itail) as indicated by a broken line in FIG. 4(D) flows inside the semiconductor switching element 101 after time t4 when VDS becomes the maximum value at the turn-off time of the semiconductor switching element 101, and a loss occurs in the semiconductor switching element 101. Accordingly, energy accumulated in parasitic inductance and parasitic capacitance in a circuit included in the inverter circuit 200 is consumed, and ringing vibration can be effectively attenuated. As is apparent from Expression (3), magnitude of the tail current (Itail) can also be controlled by adjusting the value of Vkeep, and the degree of attenuation of the ringing vibration can also be controlled.

Here, ringing will be described with reference to a comparative example to which the present embodiment is not applied. When a gate type switching element is turned off, a voltage between main terminals of the gate type switching element rapidly increases, and a current (main current) flowing between the main terminals of the gate type switching element rapidly decreases. Then, an electromotive force is generated by a parasitic inductor present in a wiring in which the gate type switching element is interposed. Due to this electromotive force, the voltage between the main terminals rises to a peak value immediately after the turn-off as indicated by the solid line in FIG. 4(E), and then the voltage increases and decreases repeatedly. In conjunction with the increase and decrease in the voltage between the main terminals, the main current also repeatedly increases and decreases as indicated by the solid line in FIG. 4D. As described above, when the gate type switching element is turned off, ringing occurs in the gate type switching element.

FIGS. 5(A), 5(B), 5(C), 5(D), 5(E), 5(F), and 5(G) are diagrams illustrating another example 1 of waveforms of the semiconductor switching element 101 when the semiconductor switching element 101 is turned off. Solid lines in each of FIGS. 5(B), 5(C), 5(D), and 5(E) indicate waveforms in the gate drive device 500 in FIG. 3 as a comparative example. Broken lines in these drawings are waveforms in the gate drive device 500 of FIG. 2 according to the present embodiment, and mainly indicate differences from the comparative example.

FIG. 5(A) illustrates the gate-off command P from the command logic unit 400, FIG. 5(B) illustrates the gate current of the semiconductor switching element 101, FIG. 5(C) illustrates a gate-source voltage of the semiconductor switching element 101, and FIG. 5(D) illustrates a drain current of the semiconductor switching element 101. FIG. 5(E) illustrates a drain-source voltage of the semiconductor switching element 101, FIG. 5(F) illustrates an output signal ($V_{OUT}$) in the detection circuit 15, and FIG. 5(G) illustrates an ON command (R) to the gate voltage pull-up MOSFET 12.

FIGS. 5(C) and 5(D) are different from FIGS. 4(C) and 4(D) when compared with FIGS. 4(A), 4(B), 4(C), 4(D), 4(E), 4(F), and 4(G).

As illustrated in FIG. 5(C), a gate-source voltage of the semiconductor switching element 101 may change gently from time B to time t5. For example, an impedance component such as wiring inductance or parasitic resistance is between the output unit 1 of the gate drive device 500 illustrated in FIG. 2 and the gate terminal G of the MOSFET. Therefore, even when an output voltage of the gate drive device 500 is changed stepwise as indicated by the broken line in FIG. 4(C), VGS of the semiconductor switching element 101 may change gently as indicated by the broken line in FIG. 5(C).

Another example 1 illustrates a case where VGS changes gently as indicated by a broken line in FIG. 5(C), and a relationship between an operation of the gate drive device 500 and the waveform is similar to the content described above with reference to FIGS. 4(A), 4(B), 4(C), 4(D), 4(E), 4(F), and 4(G).

As indicated by a broken line in FIG. 5(C), VGS of the gate-source voltage of the semiconductor switching element 101 decreases gently from Vmiller to Vkeep from time B to time t5, compared with FIG. 4(C). Therefore, as indicated by a broken line in FIG. 5(D), a tail current (Itail) flows relatively largely, and there is an effect that the ringing vibration of the semiconductor switching element 101 can be controlled more effectively.

FIGS. 6(A), 6(B), 6(C), 6(D), 6(E), 6(F), and 6(G) are diagrams illustrating another example 2 of waveforms of the semiconductor switching element 101 when the semiconductor switching element is turned off. Solid lines in FIGS. 6(B), 6(C), 6(D), and 6(E) indicate waveforms in the gate drive device 500 in FIG. 3 as a comparative example. Broken lines in these drawings are waveforms in the gate drive device 500 of FIG. 2 according to the present embodiment, and mainly indicate differences from the comparative example.

Figure 6:
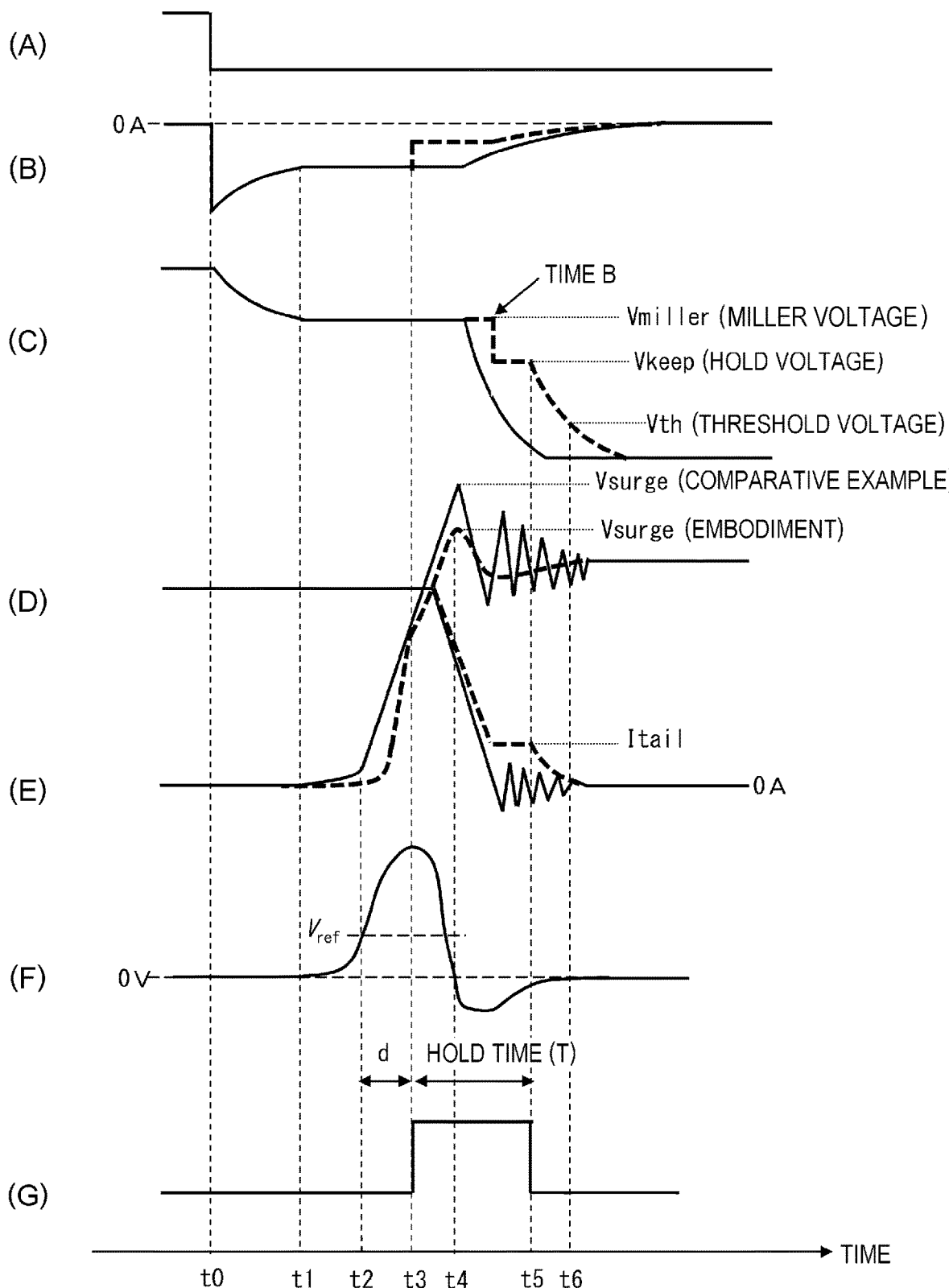
FIGS. 6(A), 6(B), 6(C), 6(D), 6(E), 6(F), and 6(G) are diagrams illustrating another example 2 of waveforms of the semiconductor switching element when the semiconductor switching element is turned off.

FIG. 6(A) illustrates a gate-off command P from the command logic unit 400, FIG. 6(B) illustrates a gate current of the semiconductor switching element 101, FIG. 6(C) illustrates a gate-source voltage of the semiconductor switching element 101, and FIG. 6(D) illustrates a drain current of the semiconductor switching element 101. FIG. 6(E) illustrates a drain-source voltage of the semiconductor switching element 101, FIG. 6(F) illustrates an output signal ($V_{OUT}$) in the detection circuit 15, and FIG. 6(G) illustrates an ON command (R) to the gate voltage pull-up MOSFET 12.

FIG. 6(E) is different from FIG. 4(E), compared with FIGS. 4(A), 4(B), 4(C), 4(D), 4(E), 4(F), and 4(G).

Figure 4:
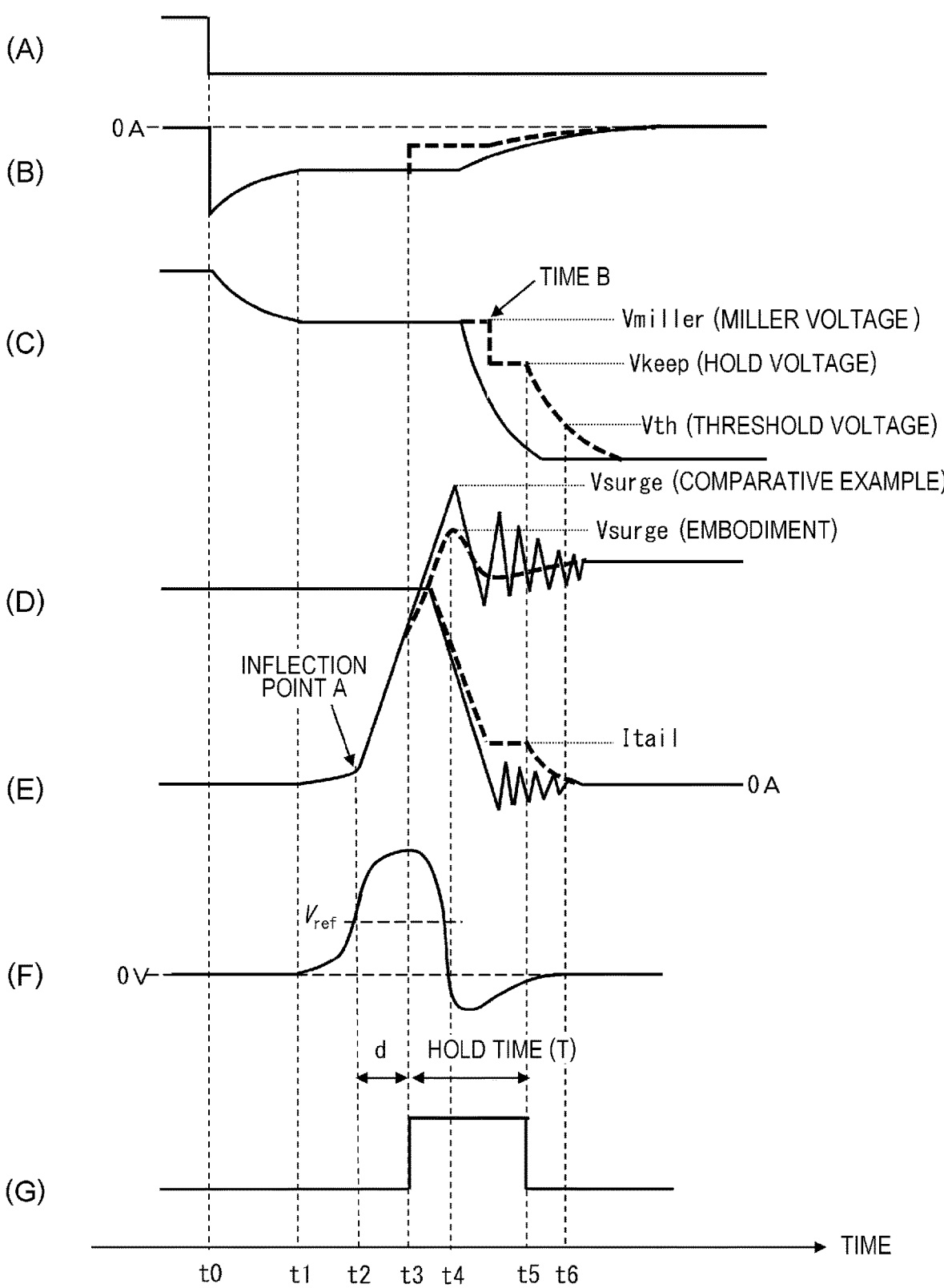
FIGS. 4(A), 4(B), 4(C), 4(D), 4(E), 4(F), and 4(G) are diagrams illustrating examples of waveforms of a semiconductor switching element when the semiconductor switching element is turned off.
Figure 5:
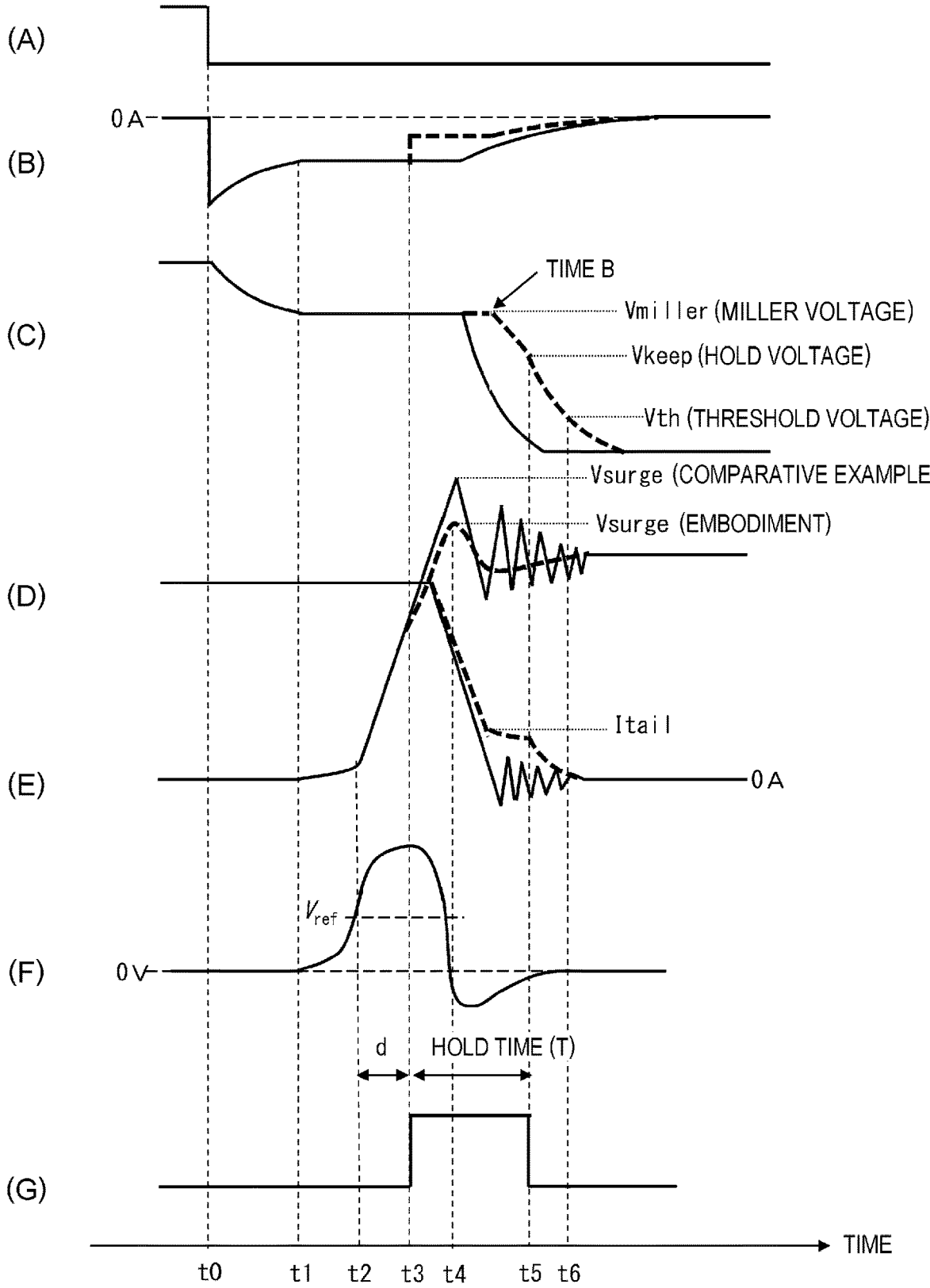
FIGS. 5(A), 5(B), 5(C), 5(D), 5(E), 5(F), and 5(G) are diagrams illustrating another example 1 of waveforms of the semiconductor switching element when the semiconductor switching element is turned off.

Another example 2 is different in that the gate driving speed before time t3 at which the gate voltage hold circuit 9 starts the operation is increased, compared with the example of FIG. 4 and another example 1 of FIG. 5. The increase in the gate driving speed is implemented, for example, by reducing the resistant value (Roff) of the off-side gate resistor 10 of the gate drive device 500 illustrated in FIG. 2. By reducing Roff, a rise speed (dv/dt) of the drain-source voltage (VDS) of the semiconductor switching element 101 increases before time t3 as indicated by the broken line in FIG. 6(E).

Accordingly, a turn-off loss (Eoff) determined by time integration of a product of VDS and the drain current (ID) can be reduced as compared with the case of the example of FIG. 4 or another example 1 of FIG. 5. On the other hand, since the gate voltage hold circuit 9 operates after time t3, the effect of inhibiting a surge voltage and ringing vibration can be obtained as in the example of FIG. 4 and the case of another example 1 of FIG. 5.

In general, in a power conversion device using a switching operation of a semiconductor switching element such as an inverter dedicated for a vehicle, it is possible to reduce the size of a passive element such as an inductor or a capacitor used for a circuit by increasing a frequency of the switching operation. Thus, it is possible to reduce the size of the device. Therefore, high frequency switching has advanced. In addition, since a SiC-MOSFET which is a majority carrier device as a semiconductor switching element does not generate a tail current at a turn-off time caused by minority carriers as in a Si-IGBT, a switching loss can be reduced. Thus, the SiC-MOSFET is appropriate for high-frequency switching. An operation limit temperature of SiC which is a wide band gap semiconductor is higher than that of Si, and a small heat sink having a large thermal resistance is also cooled. As described above, the SiC-MOSFET can contribute to a reduction in the size of the entire power conversion circuit, and is compatible with the Si-IGBT in a driving scheme. Therefore, it is conceivable that application of the SiC-MOSFET to the inverter dedicated for a vehicle will increase in the future.

However, although the SiC-MOSFET has a small switching loss, a ratio of the switching loss to the entire power loss increases as the high frequency switching advances. Therefore, it is important to further reduce the switching loss. When dv/dt at the time of switching increases due to the advance in the high frequency switching, electromagnetic noise (EMI) generated from the semiconductor switching element due to a surge voltage or ringing vibration increases. Further, as the size of the inverter dedicated for a vehicle is reduced, an influence of electromagnetic noise on the electronic devices around the semiconductor switching elements also increases. In this way, since the inhibition of the switching loss and the reduction in the noise have a trade-off relationship, a drive device capable of optimizing both the inhibition of the switching loss and the reduction in the noise is preferable in the inverter dedicated for a vehicle.

According to the present embodiment, the gate drive device 500 can reduce both the ringing vibration and the surge voltage while inhibiting the turn-off loss of the semiconductor switching element 101. Accordingly, since the surge voltage and the switching loss (heat generation) are reduced and the electromagnetic noise generated from the semiconductor switching element 101 is also reduced, it is possible to miniaturize the inverter circuit 200 including the semiconductor switching element 101, secure insulation of the electric motor 300 or the like, and inhibit the electromagnetic noise. When the electric motor 300 is mounted on a vehicle, contribution to high efficiency and high reliability of a control system of an electric vehicle or a hybrid vehicle can be achieved.

The detection circuit 15 illustrated in FIG. 2 is a means for implementing holding of the gate voltage applied to the semiconductor switching element 101 at the above-described hold voltage Vkeep before the maximum value of VDS after the rise of VDS at the turn-off time of the semiconductor switching element 101. The present invention is not limited to the detection circuit 15 illustrated in FIG. 2, and for example, a configuration described in a modification described below may be adopted.

Figure 7:
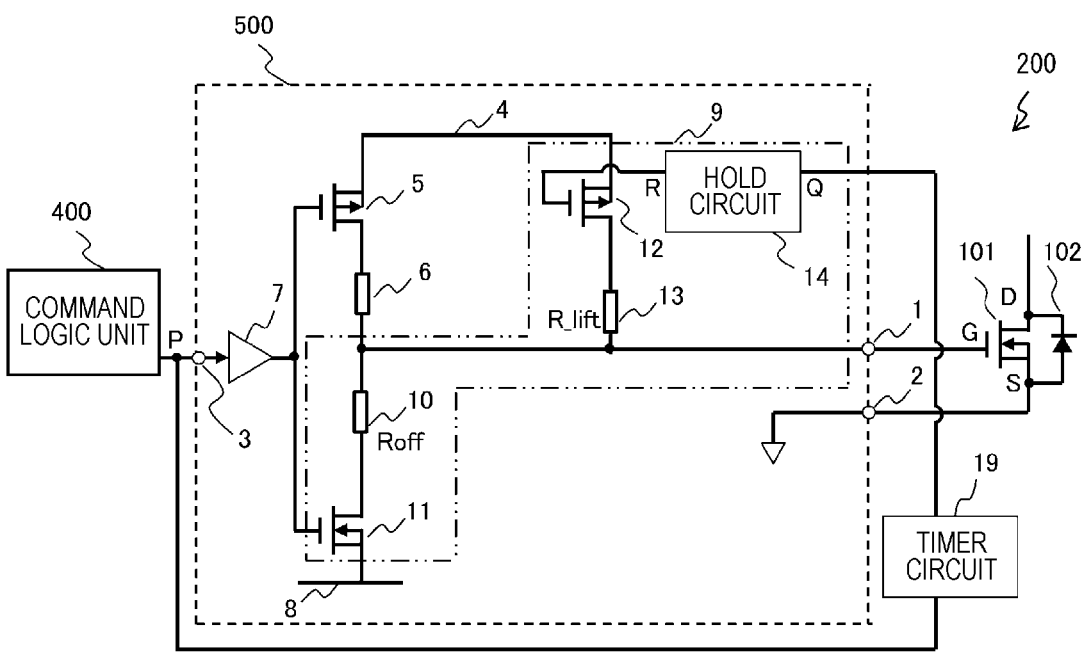
FIG. 7 is a circuit diagram of a gate drive device according to a modification of the first embodiment.

FIG. 7 is a circuit diagram of a gate drive device 500 according to a modification of the first embodiment.

As illustrated in FIG. 7, a timer circuit 19 is used instead of the detection circuit 15. The timer circuit 19 receives the gate-off command P as an input from the command logic unit 400, and outputs the detection signal Q to the hold circuit 14 after the gate-off command P is input and a predetermined time has elapsed. The same portions as those of the gate drive device 500 illustrated in FIG. 2 are denoted by the same reference numerals, and description thereof will be simplified.

Referring to the waveforms of FIG. 4, at time t0, as illustrated in FIG. 4(A), the gate-off command P to turn off the semiconductor switching element 101 is output from the command logic unit 400. The timer circuit 19 outputs the detection signal Q to the hold circuit 14, for example, at time t2 illustrated in FIG. 4 after the predetermined time has elapsed. As illustrated in FIG. 4(G), the hold circuit 14 outputs the ON command R of the gate voltage pull-up MOSFET 12 at time t3 after a certain circuit delay d has elapsed. That is, the timer circuit 19 implements holding of the gate voltage applied to the semiconductor switching element 101 at the above-described Vkeep before the maximum value of VDS after the rise of VDS at the turn-off time of the semiconductor switching element 101.

Second Embodiment

Figure 8:
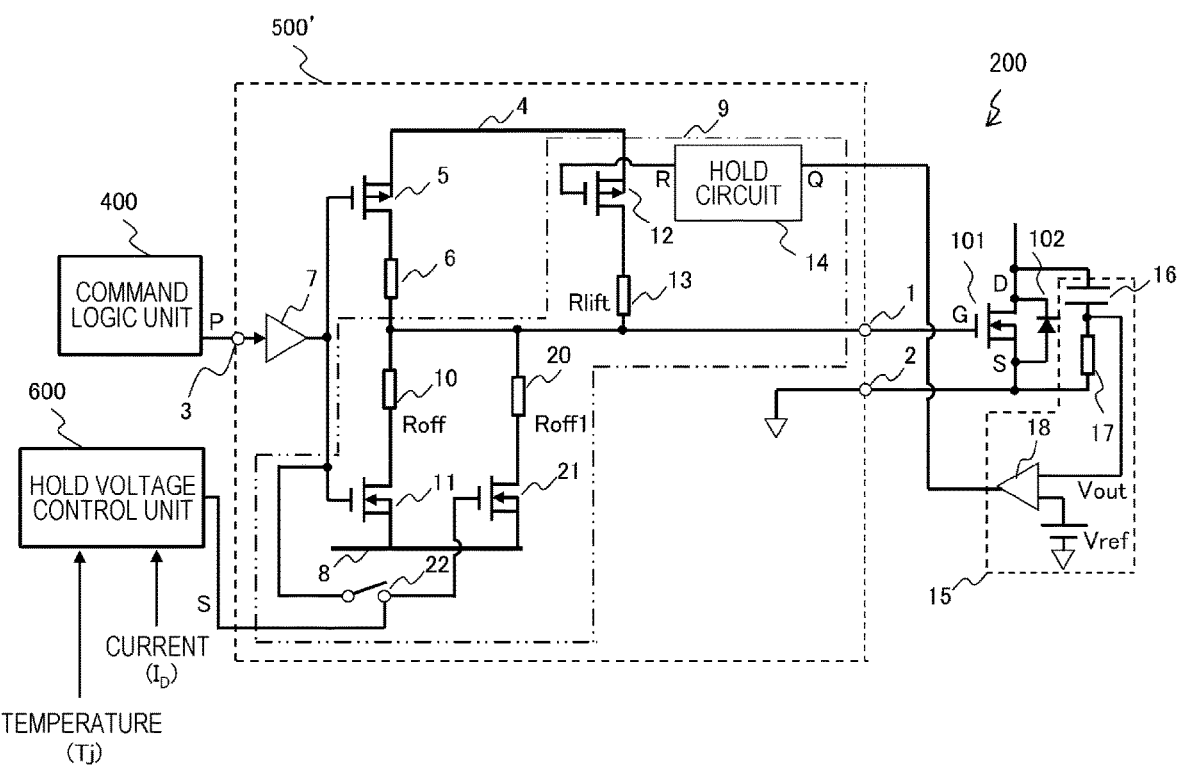
FIG. 8 is a circuit diagram of a gate drive device according to a second embodiment.

FIG. 8 is a circuit diagram of a gate drive device 500' according to the second embodiment.

FIG. 8 illustrates the semiconductor switching element 101 according to the U-phase lower arm in the inverter circuit 200 illustrated in FIG. 1 and the gate drive device 500'. In addition, the semiconductor switching elements 101 of the U-phase upper arm, the V-phase and W-phase upper and lower arms, and the gate drive devices 500 have the same configuration. Hereinafter, the configurations and operations of semiconductor switching element 101 of the U-phase lower arm and the gate drive device 500 will be described, but the configurations and operations of the other semiconductor switching elements 101 and the gate drive devices 500 are similar.

The gate drive device 500' according to the second embodiment is different from the gate drive device 500 according to the first embodiment illustrated in FIG. 2 in that a second off-side gate resistor 20, an output stage MOSFET 21, and a changeover switch 22 are added in the gate voltage hold circuit 9. In the second embodiment, a hold voltage control unit 600 is added. Other configurations are similar to those of the first embodiment illustrated in FIG. 2. The same portions as those in FIG. 2 are denoted by the same reference numerals, and description thereof will be simplified.

As illustrated in FIG. 8, the source of the output stage MOSFET 21 is connected to the negative-side power supply 8. The drain of the output stage MOSFET 21 is connected to the output unit 1 of the gate drive device 500' via the second off-side gate resistor 20. The gate of the output stage MOSFET 21 is connected to the gate of the second MOSFET 11 via the changeover switch 22. Sensing values of a temperature (Tj) of the semiconductor switching element 101, a current (ID) flowing in the semiconductor switching element 101, or an output current (ID) of the inverter circuit 200 are input to the hold voltage control unit 600. An output unit of the hold voltage control unit 600 is connected to the changeover switch 22. The temperature (Tj) of the semiconductor switching element 101 is acquired from a temperature sensor such as a thermistor (not illustrated) installed near the semiconductor switching element 101. The current (ID) flowing in the semiconductor switching element 101 or the output current (ID) of the inverter circuit 200 is acquired from a current sensor (not illustrated).

The hold voltage control unit 600 transmits a control signal S to the changeover switch 22 based on a value of the input Tj or ID. When the control signal S is received, the changeover switch 22 short-circuits the changeover switch 22, and both the gate of the second MOSFET 11 and the gate of the output stage MOSFET 21 are connected to the output unit of the buffer circuit 7. When the control signal S is not received, the changeover switch 22 opens the changeover switch 22, and only the gate of the second MOSFET 11 is connected to the output unit of the buffer circuit 7.

When the hold voltage control unit 600 transmits the control signal S and the changeover switch 22 is short-circuited, both the second MOSFET 11 and the output stage MOSFET 21 are turned on at the turn-off time of the semiconductor switching element 101. Therefore, when the gate voltage hold circuit 9 starts operating, the output voltage of the gate drive device 500' (the voltage between the output unit 1 and the reference potential 2 in FIG. 8) is held at the hold voltage Vkeep1 expressed by the following Expression (4).

$$Vkeep1 = (Vp - Vm) * Roffs / (Rlift + Roffs) + Vm \qquad (4)$$

Here, Roffs is a combined resistance in which the off-side gate resistor 10 (Roff) and the second off-side gate resistor 20 (Roff1) are connected in parallel, and Roffs<Roff is satisfied.

When the hold voltage control unit 600 does not transmit the control signal S and the changeover switch 22 is opened, only the second MOSFET 11 is turned on at the turn-off time of the MOSFET. Accordingly, when the gate voltage hold circuit 9 starts operating, the output voltage of the gate drive device 500' is held at the hold voltage Vkeep expressed by Expression (1) described in the first embodiment.

Due to a difference in a voltage division ratio by gate resistance of the semiconductor switching element 101, Vkeep1 in a case where the changeover switch 22 is short-circuited is lower than Vkeep in a case where the changeover switch 22 is opened (Vkeep1<Vkeep). That is, by opening and closing the changeover switch 22 in accordance with the sensing value of Tj or ID input to the hold voltage control unit 600, the hold voltage Vkeep during an operation of the gate voltage hold circuit 9 can be changed in accordance with an operation condition (a temperature or a current) of the semiconductor switching element 101.

Figure 9:
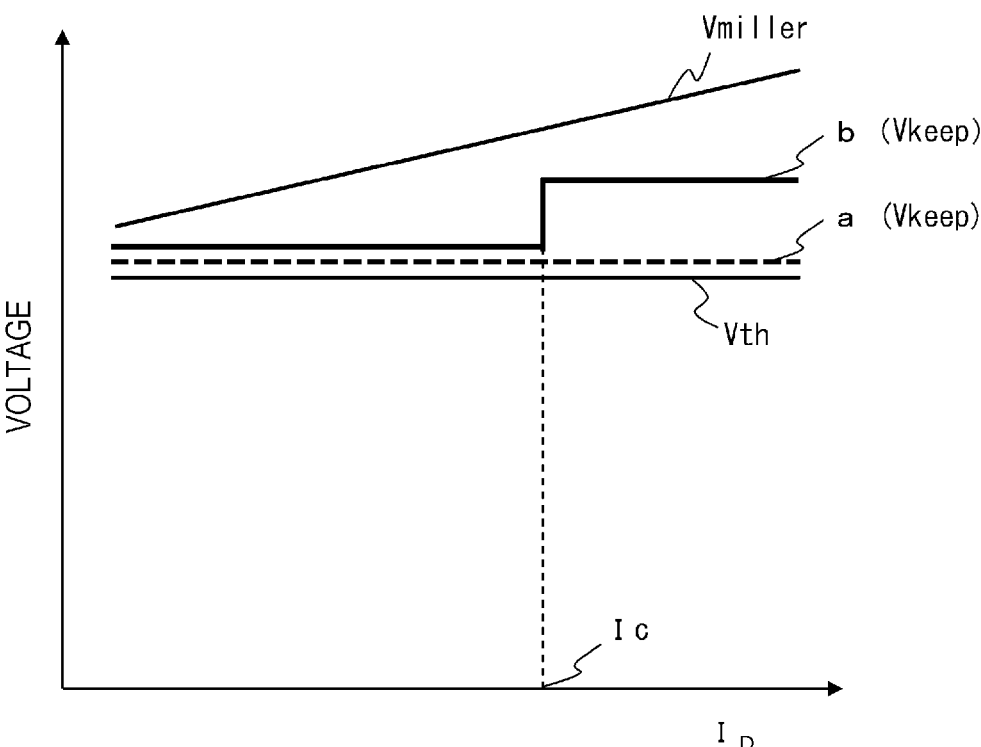
FIG. 9 is a diagram illustrating current dependency of a Miller voltage and a threshold voltage of the semiconductor switching element.

FIG. 9 is a diagram illustrating dependency of a Miller voltage (Vmiller) and a threshold voltage (Vth) of the semiconductor switching element 101 on a current. The horizontal axis represents the current ID flowing in the semiconductor switching element 101, and the vertical axis represents voltages such as a Miller voltage (Vmiller) and a threshold voltage (Vth).

As shown in Expression (2) described in the first embodiment, the larger the current ID flowing in the semiconductor switching element 101 is, the larger the Vmiller is. On the other hand, the current dependency of Vth is generally small. In the first embodiment, since the hold voltage Vkeep during the operation of the gate voltage hold circuit 9 does not change despite a change in the current ID, the hold voltage Vkeep is indicated by a broken line a of FIG. 9. At this time, as is apparent from FIG. 9, a difference voltage (Vkeep-Vth) which is the difference between Vkeep and Vth also becomes substantially constant. Accordingly, from Expression (3) described in the first embodiment, the tail current (Itail) flowing inside the semiconductor switching element 101 at time B after time t4 (see FIG. 4(D)) when VDS becomes the maximum value at the turn-off time also becomes substantially constant. In general, the larger the current ID flowing in the semiconductor switching element 101 is, the larger amplitude of the ringing vibration at the turn-off time of the semiconductor switching element 101 is. Therefore, when the current ID flowing in the semiconductor switching element 101 increases, the effect of inhbiting the ringing vibration increases when Itail is also large.

Accordingly, in the second embodiment, as indicated by a solid line b of FIG. 9, when the ID exceeds a certain current Ic, the changeover switch 22 is opened to increase Vkeep, that is, the difference voltage (Vkeep-Vth) increases, and thus Itail increases. When ID is equal to or less than Ic, the changeover switch 22 is short-circuited to reduce Vkeep, that is, the difference voltage (Vkeep-Vth) is reduced, and thus Itail is also reduced.

Accordingly, Itail increases at the time of a large current at which the ringing vibration becomes intense, the effect of inhibiting the ringing vibration is improved. Itail does not increase more than necessary in the other operation region, and thus an excessive increase in the switching loss can be prevented.

Figure 10:
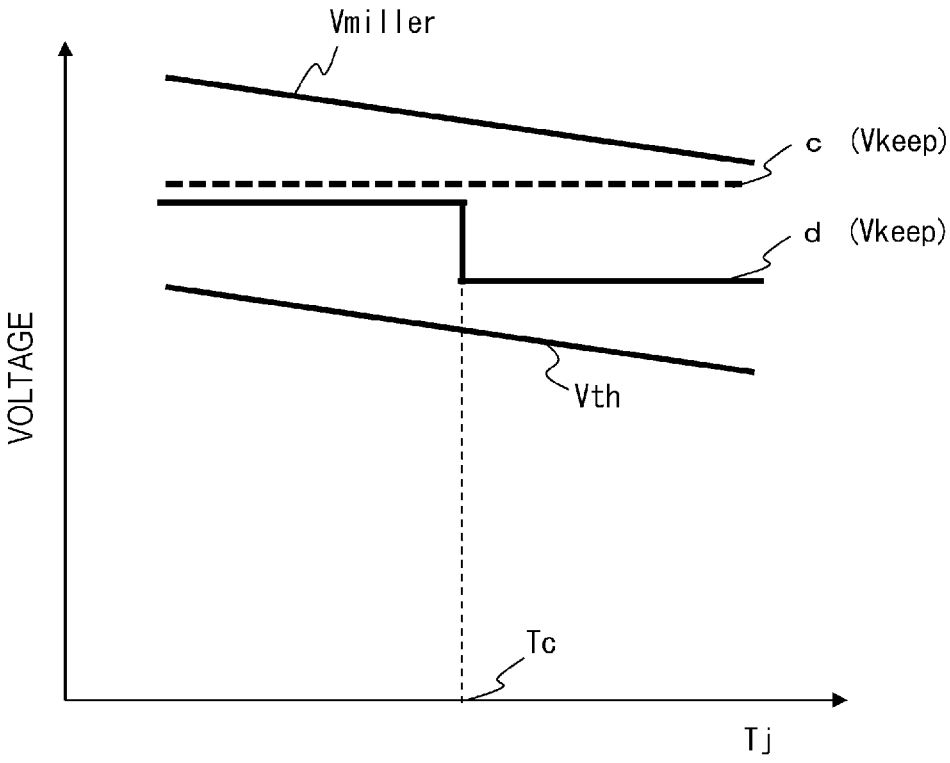
FIG. 10 is a diagram illustrating temperature dependency of a Miller voltage and a threshold voltage of the semiconductor switching element.

FIG. 10 is a diagram illustrating dependency of a Miller voltage (Vmiller) and a threshold voltage (Vth) of the semiconductor switching element 101 on temperature. The horizontal axis represents the temperature Tj of the semiconductor switching element 101, and the vertical axis represents voltages such as a Miller voltage (Vmiller) and a threshold voltage (Vth).

In general, Vth decreases as the temperature Tj increases. As shown in Expression (2) described in the first embodiment, Vmiller also decreases as Vth decreases. Therefore, as the temperature Tj of the semiconductor switching element 101 increases, both Vmiller and Vth decrease. In the first embodiment, since the hold voltage Vkeep during the operation of the gate voltage hold circuit 9 does not change despite a change in the temperature Tj, the hold voltage Vkeep is indicated by a broken line c of FIG. 10. At this time, as is apparent from FIG. 10, a difference voltage (Vkeep-Vth) between Vkeep and Vth increases as the temperature increases. Accordingly, according to Expression (3) described in the first embodiment, the tail current (Itail) flowing inside the semiconductor switching element 101 increases as the temperature increases after time t4 (see FIG. 4(D)) when VDS becomes the maximum value at the turn-off time. When the tail current (Itail) increases at a high temperature of the semiconductor switching element 101, it is conceivable that a switching loss may excessively increase, and a calorific value or an internal temperature of the semiconductor switching element 101 increases.

Therefore, in the second embodiment, as indicated by a solid line d of FIG. 10, when the temperature Tj of the semiconductor switching element 101 exceeds a certain temperature Tc, the changeover switch 22 is short-circuited to reduce Vkeep, that is, the difference voltage (Vkeep-Vth) is reduced, and thus Itail is also reduced. When Tj is equal to or less than Tc, the changeover switch 22 is opened to increase Vkeep, that is, the difference voltage (Vkeep-Vth) is increased, and thus Itail also increases.

Accordingly, it is possible to obtain a sufficient ringing suppression effect by reducing Itail and not increasing an excessive increase in a switching loss of the semiconductor switching element 101 during a high-temperature operation in which an increase in the switching loss or an increase in an internal temperature is caused and increasing Itail within an appropriate range in other operation regions.

According to the present embodiment, in addition to the effects described in the first embodiment, even when an operation environment (a temperature or a current) of the semiconductor switching element 101 is changed, a surge voltage and a switching loss (heat generation) are reduced, and thus electromagnetic noise generated from the semiconductor switching element 101 is also reduced. Therefore, robustness of control against the change in the operation environment can be obtained.

In the gate drive device 500' illustrated in FIG. 8, only one set of a component group formed by the second off-side gate resistor 20, the output stage MOSFET 21, and the changeover switch 22 is added to the gate voltage hold circuit 9. However, the present embodiment is not limited thereto, and a plurality of sets of the component groups may be added in parallel. The number of parallel component groups is increased, and the combination of opening and closing of the changeover switches of the component groups is controlled by the hold voltage control unit 600 in accordance with an operation environment (a temperature or a current) of the semiconductor switching element 101. Accordingly, a value of the hold voltage Vkeep can be changed in more detail in accordance with an operation environment (a temperature or a current). Specifically, the Vkeep switching control in accordance with a current or a temperature illustrated in FIGS. 9 and 10 can be executed in multiple stages by setting a plurality of control values [Ic, Tc] instead of one stage. Switching control of Vkeep can be executed by combining a plurality of operation environments such as a current and a temperature.

In the gate drive device 500' illustrated in FIG. 8, the gate voltage hold circuit 9 includes the component group formed by the off-side gate resistor 20, the output stage MOSFET 21, and the changeover switch 22 in parallel with the second MOSFET 11 side, but may be configured as a modification described below.

Figure 11:
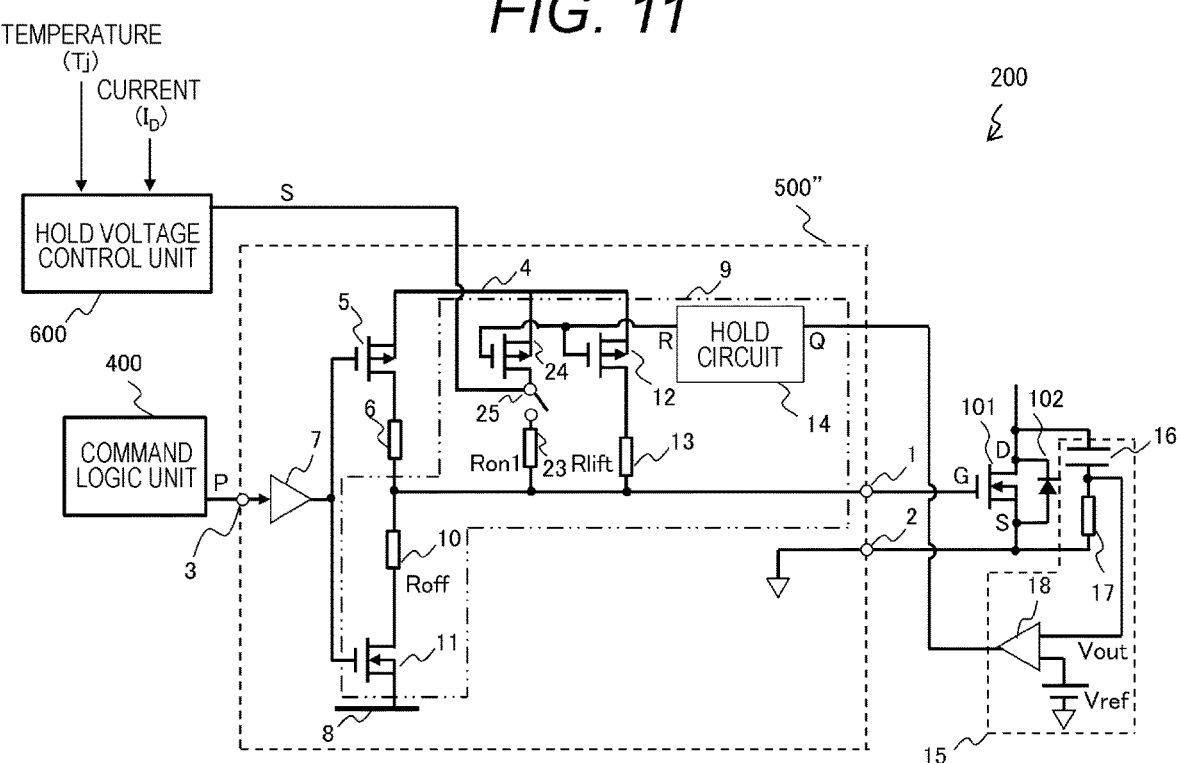
FIG. 11 is a circuit diagram of a gate drive device according to a modification of the second embodiment.

FIG. 11 is a circuit diagram of a gate drive device 500" according to a modification of the second embodiment.

In the gate drive device 500" according to the modification illustrated in FIG. 11, a second on-side gate resistor 23, an output stage MOSFET 24, and a changeover switch 25 are added to the gate voltage hold circuit 9, compared with the gate drive device 500' illustrated in FIG. 8. Further, the second off-side gate resistor 20, the output stage MOSFET 21, and the changeover switch 22 illustrated in FIG. 8 are eliminated. The other configuration is similar to that of the second embodiment illustrated in FIG. 8. The same portions as those in FIGS. 8 and 2 are denoted by the same reference numerals, and description thereof will be simplified.

As illustrated in FIG. 11, the source of the output stage MOSFET 24 is connected to the positive-side power supply 4. The drain of the output stage MOSFET 24 is connected to the output unit 1 of the gate drive device 500" via the second on-side gate resistor 23 and the changeover switch 25. The gate of the output stage MOSFET 24 is connected to an output unit R of the hold circuit 14 along with the gate of the gate voltage pull-up MOSFET 12. Sensing values of a temperature (Tj) of the semiconductor switching element 101, a current (ID) flowing in the semiconductor switching element 101, or an output current (ID) of the inverter circuit 200 are input to the hold voltage control unit 600, and an output unit of the hold voltage control unit 600 is connected to the changeover switch 25.

The hold voltage control unit 600 transmits the control signal S to the changeover switch 25 based on the value of the input Tj or ID. When the control signal S is received, the changeover switch 25 short-circuits the changeover switch 25, and both the gate voltage pull-up MOSFET 12 and the output stage MOSFET 24 are connected to the output unit 1 of the gate drive device 500". Accordingly, when the gate voltage hold circuit 9 operates, an output voltage (a voltage between the output unit 1 and the reference potential 2) of the gate drive device 500" is held at a hold voltage Vkeep2 shown in the following Expression (5).

$$Vkeep2=(Vp-Vm)*Roff/(Rons+Roff)+Vm \tag{5}$$

Here, Rons is combined resistance obtained by paralleliz-ing the gate voltage pull-up resistor 13 (Rlift) and the second on-side gate resistor 23 (Ron1), and Rons<Rlift is satisfied.

When the control signal S is not received, the changeover switch 25 opens the changeover switch 25, and only the gate voltage pull-up MOSFET 12 is connected to the output unit 1 of the gate drive device 500". Accordingly, when the gate voltage hold circuit 9 operates, the output voltage of the gate drive device 500" is held at the hold voltage Vkeep expressed by Expression (1) described in the first embodiment.

From Expressions (1) and (5), Vkeep2 in a case where the changeover switch 25 is short-circuited is higher than Vkeep in a case where the changeover switch 25 is released (Vkeep2>Vkeep) due to a difference in a voltage division ratio by the gate resistance. That is, by opening and closing the changeover switch 25 in accordance with the sensing value of Tj or ID input to the hold voltage control unit 600, the hold voltage Vkeep during an operation of the gate voltage hold circuit 9 can be changed in accordance with the operation environment (a temperature or a current) of the semiconductor switching element 101. The control of the changeover switch 25 in accordance with the change in the operation environment of the semiconductor switching element 101 is similar to the content described with reference to, for example, FIG. 9 or 10.

According to the above-described embodiments, the following operational effects can be obtained.

(1) A drive device for the voltage-driven semiconductor switching element 101 includes: a gate drive circuit that drives the semiconductor switching element 101; and the gate voltage hold circuit 9 that holds a gate voltage applied to the semiconductor switching element 101 at the prede-termined hold voltage Vkeep higher than the threshold voltage Vth of the semiconductor switching element 101 and lower than the Miller voltage Vmiller of the semiconductor switching element 101. The gate voltage hold circuit 9 starts an operation of holding the gate voltage at the hold voltage Vkeep after a rise of a voltage between the main terminals of the semiconductor switching element 101 at a turn-off time of the semiconductor switching element 101 and before a maximum value of the voltage between the main terminals. Accordingly, it is possible to reduce a surge voltage when the switching element is turned off.

(2) The driving method for the voltage-driven semicon-ductor switching element 101 is a driving method for the semiconductor switching element 101. The method includes starting an operation of holding a gate voltage applied to the semiconductor element at a predetermined hold voltage higher than a threshold voltage of the semiconductor switch-ing element 101 and lower than a Miller voltage of the semiconductor switching element 101 after a rise of a voltage between main terminals of the semiconductor switching element 101 at a turn-off time of the semiconduc-tor switching element 101 before a maximum value of a voltage between the main terminals. Accordingly, it is possible to reduce a surge voltage when the switching element is turned off.

(Modification)

The present invention can be implemented by modifying the above-described first and second embodiments as fol-lows.

(1) In the first and second embodiments, the three-phase inverter circuit 200 has been described as an example, but the present invention is not limited thereto and can be applied to a power conversion device including a pair of upper and lower arms. The pair of upper and lower arms may be configured with a power semiconductor module in which a single arm or a plurality of arms are stored in a case and electrode terminals are drawn out of the case. The gate drive devices 500, 500', and 500" may be stored (incorporated) in the power semiconductor module.

The present invention is not limited to the above-de-scribed embodiments, and other forms conceivable within the scope of the technical idea of the present invention are also included within the scope of the present invention as long as the features of the present invention are not impaired. Configurations in which the above-described embodiment and a plurality of modifications are combined may be employed, and the present invention is not neces-sarily limited to embodiments including all the configura-tions described above. It is possible to add, delete, and replace other configurations to, from and with some of the configurations of each embodiment.

REFERENCE SIGNS LIST

1 output unit of gate drive device
2 reference potential
3 input unit of gate drive device
4 positive-side power supply
5 first MOSFET
6 on-side gate resistor
7 buffer circuit
8 negative-side power supply
9 gate voltage hold circuit
10 off-side gate resistor
11 second MOSFET
12 gate voltage pull-up MOSFET
13 gate voltage pull-up resistor
14 hold circuit
15 detection circuit
16 capacitor
17 resistor
18 comparator
19 timer circuit
20 second off-side gate resistor
21, 24 output stage MOSFET
22, 25 changeover switch
23 second on-side gate resistor
100 battery
101 voltage-driven semiconductor switching element (for example, a SiC-MOSFET)
102 freewheeling diode
110 smoothing capacitor
200 inverter circuit
300 electric motor
310 winding of electric motor
400 command logic unit
500, 500', 500" gate drive device
600 hold voltage control unit

The invention claimed is:

1. A drive device for a voltage-driven semiconductor switching element comprising:
    a gate drive circuit configured to drive the semiconductor switching element; and
    a gate voltage hold circuit configured to hold a gate voltage applied to the semiconductor switching element at a predetermined hold voltage higher than a threshold voltage of the semiconductor switching element and lower than a Miller voltage of the semiconductor switching element,
    wherein the gate voltage hold circuit starts an operation of holding the gate voltage at the hold voltage after a rise of a voltage between main terminals of the semiconductor switching element at a turn-off time of the semiconductor switching element and before a maximum value of the voltage between the main terminals.

2. The drive device for the semiconductor switching element according to claim 1, comprising a detection circuit configured to detect a turn-off state of the semiconductor switching element, wherein
    the gate voltage hold circuit starts the operation in response to a detection signal of the detection circuit.

3. The drive device for the semiconductor switching element according to claim 1, comprising a timer circuit configured to measure that a predetermined time has elapsed from a gate-off command to the semiconductor switching element, wherein
    the gate voltage hold circuit starts the operation after the predetermined time has elapsed for the timer circuit.

4. The drive device for the semiconductor switching element according to claim 1, wherein the gate voltage hold circuit changes the hold voltage based on a temperature of the semiconductor switching element and/or a current value flowing in the semiconductor switching element.

5. The drive device for the semiconductor switching element according to claim 4, wherein the gate voltage hold circuit sets the gate voltage when the temperature of the semiconductor switching element is a first temperature to the hold voltage higher than the gate voltage when the temperature of the semiconductor switching element is a second temperature higher than the first temperature.

6. The drive device for a semiconductor switching element according to claim 4, wherein the gate voltage hold circuit sets the gate voltage when the current value of the semiconductor switching element is a first current value to the hold voltage lower than the gate voltage when the current value of the semiconductor switching element is a second current value higher than the first current value.

7. A power conversion device comprising:
    the drive device for the semiconductor switching element according to claim 1; and
    an inverter circuit including the semiconductor switching element.

8. A driving method for a voltage-driven semiconductor switching element, the method comprising starting an operation of holding a gate voltage applied to the semiconductor element at a predetermined hold voltage higher than a threshold voltage of the semiconductor switching element and lower than a Miller voltage of the semiconductor switching element after a rise of a voltage between main terminals of the semiconductor switching element at a turn-off time of the semiconductor switching element and before a maximum value of the voltage between the main terminals.

9. The driving method for the semiconductor switching element according to claim 8, wherein the hold voltage is changed based on a temperature of the semiconductor switching element and/or a value of a current flowing in the semiconductor switching element.

* * * * *